US012692588B2

(12) United States Patent
Park et al.

(10) Patent No.: US 12,692,588 B2
(45) Date of Patent: Jul. 28, 2026

(54) METHOD AND APPARATUS FOR MANUFACTURING DISPLAY DEVICE

(71) Applicant: Samsung Display Co., Ltd., Yongin-si (KR)

(72) Inventors: Heemin Park, Yongin-si (KR); Arong Kim, Yongin-si (KR); Youngmin Moon, Yongin-si (KR); Youngho Park, Yongin-si (KR); Areum Lee, Yongin-si (KR); Sungsoon Im, Yongin-si (KR); Junho Jo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 383 days.

(21) Appl. No.: 18/347,104

(22) Filed: Jul. 5, 2023

(65) Prior Publication Data

US 2024/0102145 A1    Mar. 28, 2024

(30) Foreign Application Priority Data

Sep. 26, 2022    (KR) ........................ 10-2022-0121975

(51) Int. Cl.
*C23C 14/04* (2006.01)
*H10K 59/12* (2023.01)
*H10K 71/16* (2023.01)

(52) U.S. Cl.
CPC ....... *C23C 14/042* (2013.01); *H10K 59/1201* (2023.02); *H10K 71/166* (2023.02)

(58) Field of Classification Search
None
See application file for complete search history.

(56) References Cited

U.S. PATENT DOCUMENTS

| | | | |
|---|---|---|---|
| 9,847,485 B2 | 12/2017 | Min | |
| 2008/0018236 A1* | 1/2008 | Arai | ..................... H10K 71/166 |
| | | | 445/24 |
| 2011/0220019 A1* | 9/2011 | Lee | ........................ C23C 14/042 |
| | | | 118/504 |
| 2022/0010421 A1 | 1/2022 | Moon et al. | |
| 2022/0064779 A1 | 3/2022 | Moon et al. | |
| 2022/0181595 A1 | 6/2022 | Kim | |

FOREIGN PATENT DOCUMENTS

| | | |
|---|---|---|
| KR | 20110101767 A | 9/2011 |
| KR | 10-2015-0106504 | 9/2015 |
| KR | 10-2017-0056769 | 5/2017 |
| KR | 10-2083947 | 4/2020 |
| KR | 10-2022-0006152 | 1/2022 |
| KR | 10-2022-0030437 | 3/2022 |

* cited by examiner

*Primary Examiner* — Jason Berman
(74) *Attorney, Agent, or Firm* — CANTOR COLBURN LLP

(57) ABSTRACT

An apparatus for manufacturing a display device includes a mask assembly, and a deposition source that supplies a deposition material toward the mask assembly. The mask assembly includes a mask frame including a first opening, a sheet portion fixed on the mask, overlapping a portion of the first opening in a plan view, and including a plurality of second openings, a plurality of first masks corresponding to the plurality of second openings and fixed on the sheet portion, each including a plurality of third openings, and a second mask arranged on another portion of the first opening defined by an edge of the sheet portion and inner surfaces of the first opening, fixed on the mask frame, and including a plurality of fourth openings.

16 Claims, 15 Drawing Sheets

METHOD AND APPARATUS FOR MANUFACTURING DISPLAY DEVICE

CROSS-REFERENCE TO RELATED APPLICATION(S)

This application claims priority to and benefits of Korean Patent Application No. 10-2022-0121975 under 35 U.S.C. § 119, filed on Sep. 26, 2022, in the Korean Intellectual Property Office (KIPO), the entire contents of which are incorporated herein by reference.

BACKGROUND

1. Technical Field

One or more embodiments relate to a display device a method for manufacturing a display device.

2. Description of the Related Art

Mobile electronic devices have been widely used. In addition to small electronic devices, such as mobile phones, tablet personal computers (PCs) have recently been widely used as mobile electronic devices.

In order to support various functions, such a mobile electronic device includes a display device for providing a user with visual information, such as images or video. Recently, as other parts for driving the display device have become smaller, the proportion occupied by display devices in electronic devices has been gradually increasing, and a structure capable of being bent in a flat state to have a certain angle has also been developed.

SUMMARY

One or more embodiments include a mask assembly including both of a first mask fixed on a sheet portion and a second mask directly fixed on a mask frame.

However, this technical problem is an example, and technical problems to be solved by one or more embodiments are not limited thereto.

Additional aspects will be set forth in part in the description which follows and, in part, will be apparent from the description, or may be learned by practice of the embodiments of the disclosure.

According to one or more embodiments, an apparatus for manufacturing a display device may include a mask assembly, and a deposition source that supplies a deposition material toward the mask assembly. The mask assembly may include a mask frame including a first opening, a sheet portion fixed on the mask frame, overlapping a portion of the first opening in a plan view, and including a plurality of second openings, a plurality of first masks corresponding to the plurality of second openings and fixed on the sheet portion, each of the plurality of first masks including a plurality of third openings, and a second mask arranged on another portion of the first opening defined by an edge of the sheet portion and inner surfaces of the first opening, fixed on the mask frame, and including a plurality of fourth openings.

An area of the sheet portion in a plan view may be greater than an area of the second mask in a plan view.

The sheet portion may further include a first sheet portion including a plurality of 2-1 openings, and a second sheet portion spaced apart from the first sheet portion and including a plurality of 2-2 openings.

An area of the first sheet portion and an area of the second sheet portion in a plan view may be different from each other.

An area of each of the plurality of 2-1 openings and an area of each of the plurality of 2-2 openings in a plan view may be different from each other.

The plurality of first masks may further include a plurality of 1-1 masks corresponding to the 2-1 openings, and a plurality of 1-2 masks corresponding to the 2-2 openings. An area of each of the plurality of 1-1 masks and an area of each of the plurality of 1-2 masks in a plan view may be different from each other.

The first sheet portion and the second sheet portion may be space apart from each other, and the second mask may be disposed between the first sheet portion and the second sheet portion.

The second mask may further include a 2-1 mask, and a 2-2 mask spaced apart from the 2-1 mask.

The 2-1 mask and the 2-2 mask may be spaced apart from each other, and the sheet portion may be disposed between the 2-1 mask and the 2-2 mask.

The mask assembly may further include a shield stick fixed on the mask frame crossing the first opening along a boundary between the sheet portion and the second mask.

According to one or more embodiments, a method of manufacturing a display device may include arranging a mask assembly, and supplying a deposition material toward the mask assembly. The arranging of the mask assembly may include arranging a mask frame including a first opening, a sheet portion fixing operation including tensioning a sheet portion including a plurality of second openings and fixing the sheet portion to the mask frame to overlap a portion of the first opening in a plan view, a first mask fixing operation including tensioning a plurality of first masks and fixing the plurality of first masks to the sheet portion to correspond to the plurality of second openings, and a second mask fixing operation including tensioning a second mask and fixing the second mask to the mask frame on another portion of the first opening defined by an edge of the sheet portion and inner surfaces of the first opening.

An area of the sheet portion in a plan view may be greater than an area of the second mask in a plan view.

The fixing of the sheet portion may include fixing a first sheet portion including a plurality of 2-1 openings to the mask frame, and fixing a second sheet portion including a plurality of 2-2 openings to the mask frame to be spaced apart from the first sheet portion.

An area of the first sheet portion and an area of the second sheet portion in a plan view may be different from each other.

An area of each of the plurality of 2-1 openings and an area of each of the plurality of 2-2 openings in a plan view may be different from each other.

The fixing of the plurality of first masks may include fixing a plurality of 1-1 masks to the sheet portion to correspond to the plurality of 2-1 openings, and fixing a plurality of 1-2 masks to the sheet portion to correspond to the plurality of 2-2 openings. An area of each of the plurality of 1-1 masks and an area of each of the plurality of 1-2 masks in a plan view may be different from each other.

The first sheet portion and the second sheet portion may be spaced apart from each other, and the second mask may be disposed between the first sheet portion and the second sheet portion.

The fixing of the second mask may include fixing a 2-1 mask to the mask frame, and fixing a 2-2 mask to the mask frame spaced apart from the 2-1 mask.

The 2-1 mask and the 2-2 mask may be spaced apart from each other, and the sheet portion may be disposed between the 2-1 mask and the 2-2 mask.

The arranging of the mask assembly may further include tensioning a shield stick and fixing the shield stick to the mask frame crossing the first opening along a boundary between the sheet portion and the second mask.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 9 is a plan view of a mask assembly according to another embodiment;

FIG. 10 is a plan view of a mask assembly according to another embodiment;

FIG. 11 is a plan view of a mask assembly according to another embodiment;

DETAILED DESCRIPTION OF THE EMBODIMENTS

Figure 1:
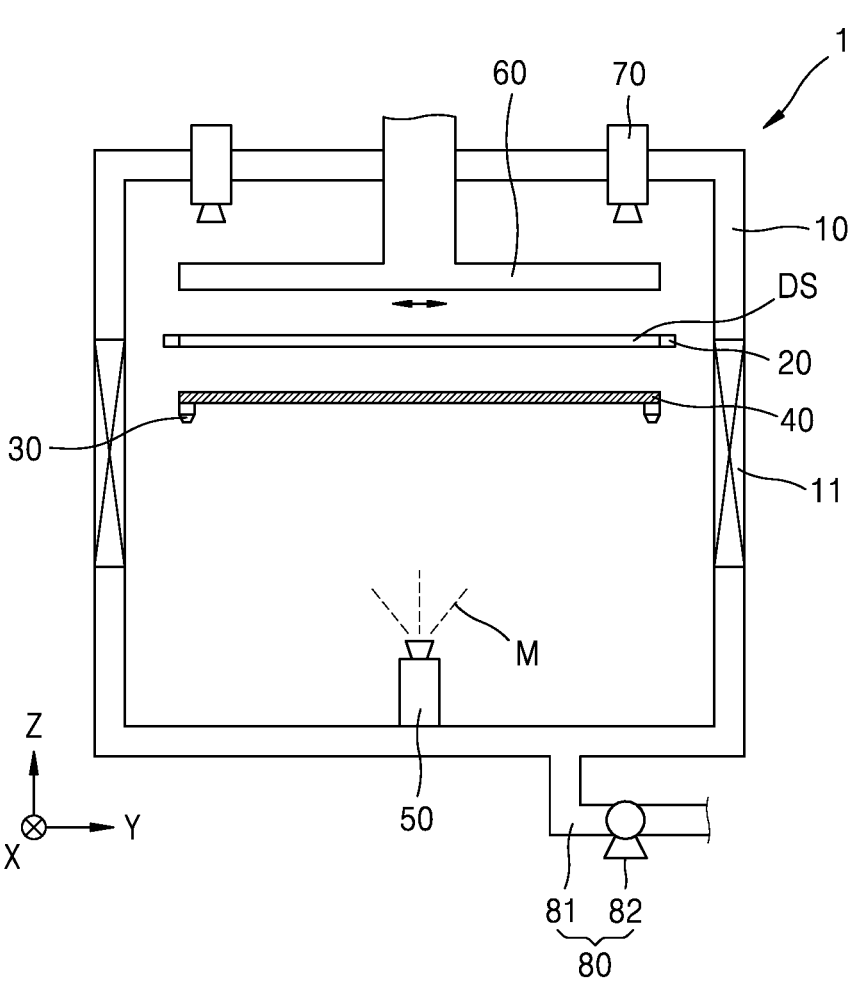
FIG. 1 is a schematic cross-sectional view of an apparatus for manufacturing a display device, according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

As the description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the embodiments may have different forms and should not be construed as being limited to the descriptions set forth herein.

One or more embodiments will be described below in more detail with reference to the accompanying drawings. Those elements that are the same or are in correspondence with each other are rendered the same reference numeral regardless of the figure number, and redundant descriptions thereof are omitted.

Although the terms "first", "second", etc. may be used herein to describe various types of elements, these elements should not be limited by these terms. These terms are used to distinguish one element from another element. Thus, a first element discussed below could be termed a second element without departing from the teachings of the disclosure.

The terminology used herein is for the purpose of describing particular embodiments and is not intended to be limiting. As used herein, the singular forms, "a", "an", and "the" are intended to include the plural forms as well, unless the context clearly indicates otherwise.

Moreover, the terms "comprises", "comprising", "has", "having", "includes", and/or "including" when used in this specification, specify the presence of stated features, integers, steps, operations, elements, components, and/or groups thereof, but do not preclude the presence or addition of one or more other features, integers, steps, operations, elements, components, and/or groups thereof.

It will be further understood that, when a layer, region, or element is referred to as being on another layer, region, or element, it may be directly or indirectly on the other layer, region, or element. That is, for example, intervening layers, regions, or elements may be present.

Sizes of elements in the drawings may be exaggerated or reduced for convenience of explanation. For example, since sizes and thicknesses of elements in the drawings are arbitrarily illustrated for convenience of explanation, the following embodiments are not limited thereto.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When an embodiment may be implemented differently, a certain process order may be performed differently from the described order. For example, two consecutively described processes may be performed substantially at the same time or performed in an order opposite to the described order.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic cross-sectional view of an apparatus 1 for manufacturing a display device, according to an embodiment.

The apparatus 1 may include a chamber 10, a first support 20, a second support 30, a mask assembly 40, a deposition source 50, a magnetic force unit 60, a vision unit 70, and a pressure adjustor 80.

The chamber 10 may include a space therein and may receive a display substrate DS and the mask assembly 40. A portion of the chamber 10 may be open, and a gate valve 11 may be provided in the open portion of the chamber 10. The open portion of the chamber 10 may be opened or closed according to an operation of the gate valve 11.

The display substrate DS may be a display substrate DS in the process of manufacturing a display device, in which at least one of an organic layer, an inorganic layer, or a metal layer is deposited on a substrate 100 described below. In another embodiment, the display substrate DS may be a substrate 100 on which none of an organic layer, an inorganic layer, and a metal layer has been deposited yet.

The first support 20 may support the display substrate DS. The first support 20 may be in the form of a plate fixed inside the chamber 10. In another embodiment, the first support 20 may be in the form of a shuttle on which the display substrate DS is seated and which is linearly moveable in the chamber 10. In another embodiment, the first support 20 may include an electrostatic chuck or an adhesive chuck which is arranged in the chamber 10 to be fixed to the chamber 10 or movable in the chamber 10.

The second support 30 may support the mask assembly 40. The second support 30 may be disposed inside the chamber 10. The second support 30 may fine-adjust a location of the mask assembly 40. The second support 30 may include a separate driver or alignment unit for moving the mask assembly 40 in different directions.

In another embodiment, the second support 30 may be in the form of a shuttle, and the second support 30 may have the mask assembly 40 seated thereon and may transport the mask assembly 40. For example, the second support 30 may move to the outside of the chamber 10 and have the mask assembly 40 seated thereon and may enter the chamber 10 from outside the chamber 10.

In an embodiment, the first support 20 and the second support 30 may be integral with each other, and the first support 20 and the second support 30 may include a movable shuttle. The first support 20 and the second support 30 may include a structure that fixes the mask assembly 40 and the display substrate DS in a state that the display substrate DS is seated on the mask assembly 40, and may linearly move the display substrate DS and the mask assembly 40 simultaneously.

Hereinafter, a form in which the first support 20 and the second support 30 are separate from each other and arranged at different locations and a form in which the first support 20 and the second support 30 are arranged in the chamber 10 will be described in detail.

The mask assembly 40 may be arranged in the chamber 10 to face the display substrate DS. A deposition material M may pass through the mask assembly 40 and be deposited on the display substrate DS.

The deposition source 50 may face the mask assembly 40, and may supply the deposition material M such that the deposition material M passes through a deposition area of the mask assembly 40 and is deposited on the display substrate DS. In an embodiment, the deposition source 50 may evaporate or sublimate the deposition material M by applying heat to the deposition material M. The deposition source 50 may be fixed inside the chamber 10 or may be arranged in the chamber 10 to be linearly moveable in a direction.

The magnetic force unit 60 may be arranged in the chamber 10 to face the display substrate DS and/or the mask assembly 40. In an embodiment, the magnetic force unit 60 may apply force to the mask assembly 40 toward the display substrate DS by applying magnetic force to the mask assembly 40.

The vision unit 70 may be arranged in the chamber 10 and may detect locations of the display substrate DS and the mask assembly 40. In an embodiment, the vision unit 70 may include a camera for photographing the display substrate DS and the mask assembly 40. Based on an image taken by the vision unit 70, locations of the display substrate DS and the mask assembly 40 may be recognized, and deformation (or misalignment) of the mask assembly 40 may be checked. Based on the image, a location of the display substrate DS may be fine-adjusted by the first support 20, or a location of the mask assembly 40 may be fine-adjusted by the second support 30. Hereinafter, a case in which a location of the mask assembly 40 is fine-adjusted by the second support 30 to align locations of the display substrate DS and the mask assembly 40 with each other will be described in detail.

The pressure adjustor 80 may be connected to the chamber 10 and may adjust pressure of the inside of the chamber 10. For example, the pressure adjustor 80 may adjust pressure of the inside of the chamber 10 to a level that is the same as or similar to atmospheric pressure. The pressure adjustor 80 may also adjust pressure of the inside of the chamber 10 to a level that is the same as or similar to that of a vacuum state.

The pressure adjustor 80 may include a connection pipe 81 connected to the chamber 10 and a pump 82 mounted on the connection pipe 81. In an embodiment, external air may be introduced through the connection pipe 81 or a gas inside the chamber 10 may be guided to the outside through the connection pipe 81 according to an operation of the pump 82.

According to a method of manufacturing a display device (not shown) by using the apparatus 1 described above, the display substrate DS may be prepared first.

The pressure adjustor 80 may maintain pressure of the inside of the chamber 10 at a level that is the same as or similar to atmospheric pressure, and the gate valve 11 may operate to open an open portion of the chamber 10.

The display substrate DS may be placed from the outside of the chamber 10 to the inside of the chamber 10. The display substrate DS may be placed into the chamber 10 in various ways. For example, the display substrate DS may be placed from the outside of the chamber 10 to the inside of the chamber 10 by a robot arm, etc. arranged outside the chamber 10. In another embodiment, in case that the first support 20 has a shuttle form, the first support 20 may be moved from the inside of the chamber 10 to the outside of the chamber 10, and the display substrate DS may be seated on the first support 20 by a separate robot arm, etc. arranged outside the chamber 10, and the first support 20 may be placed from the outside of the chamber 10 to the inside of the chamber 10.

As described above, the mask assembly 40 may be disposed inside the chamber 10. In another embodiment, in the same or similar manner to the display substrate DS, the mask assembly 40 may be placed from the outside of the chamber 10 to the inside of the chamber 10.

After the display substrate DS is placed to the inside of the chamber 10, the display substrate DS may be seated on the first support 20. The vision unit 70 may detect locations of the display substrate DS and the mask assembly 40. Locations of the display substrate DS and the mask assembly 40 may be recognized based on an image taken by the vision unit 70. The apparatus 1 may include a separate controller (not shown) and may recognize locations of the display substrate DS and the mask assembly 40.

After locations of the display substrate DS and the mask assembly 40 have been recognized, the second support 30 may fine-adjust a location of the mask assembly 40.

The deposition source 50 may operate to supply the deposition material M to the mask assembly 40, and the deposition material M having passed through the mask assembly 40 may be deposited on the display substrate DS. The deposition source 50 may move parallel to a surface of the display substrate DS and the mask assembly 40, or the display substrate DS and the mask assembly 40 may move parallel to a surface of the deposition source 50. For example, the deposition source 50 may move relative to the display substrate DS and the mask assembly 40. In an embodiment, the pump 82 may draw out a gas from the inside of the chamber 10 and discharge the gas to the outside, thereby maintaining pressure of the inside of the chamber 10 at a level that is the same as or similar to a vacuum state.

The deposition material M supplied by the deposition source 50 as described above may pass through the mask assembly 40 and be deposited on the display substrate DS, and accordingly, multiple layers which are stacked on a display device described below, for example, at least one of an organic layer, an inorganic layer, or a metal layer, may be formed.

Figure 2:
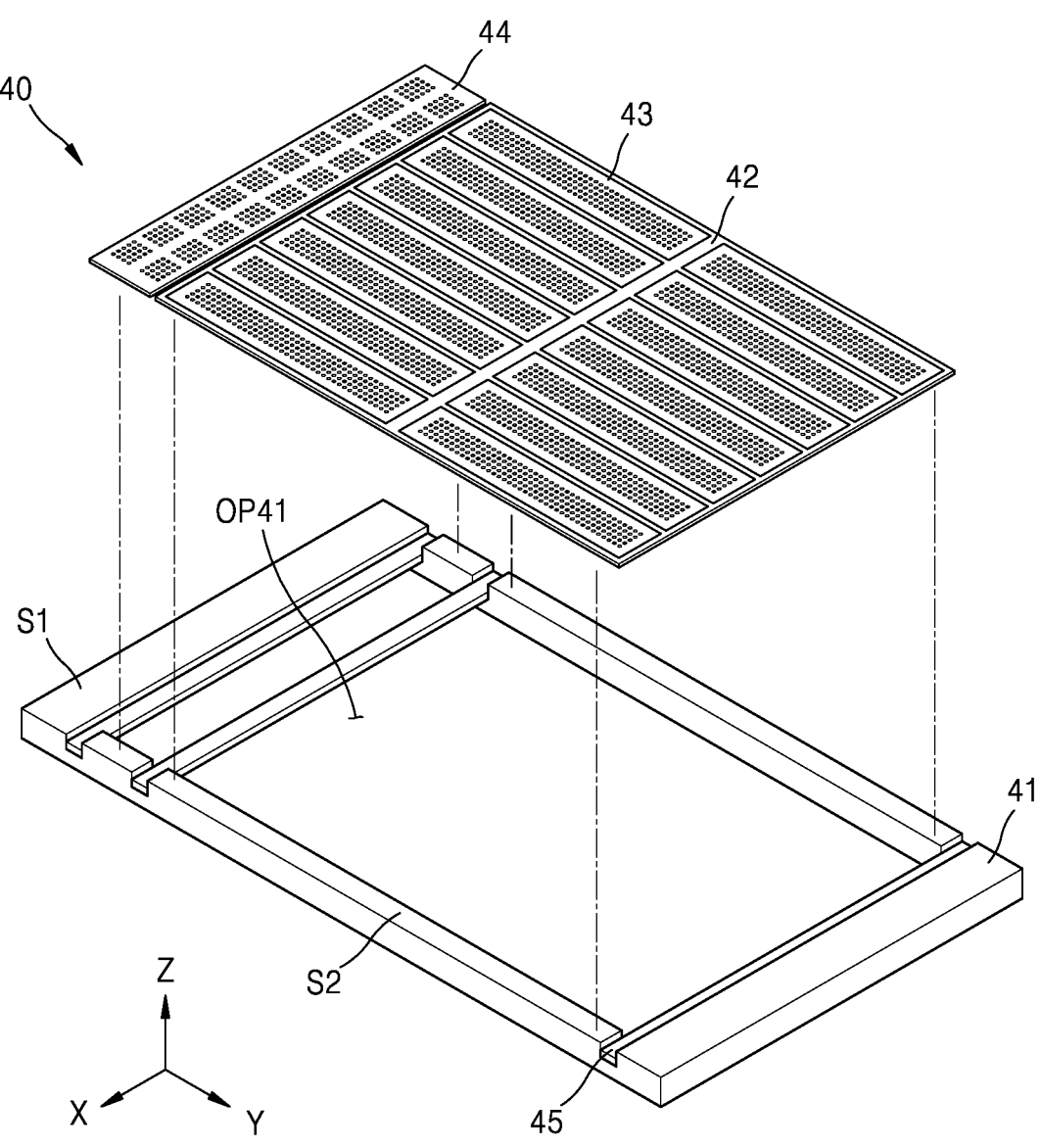
FIG. 2 is a schematic perspective view of a mask assembly according to an embodiment.

FIG. 2 is a schematic perspective view of the mask assembly 40 according to an embodiment.

Referring to FIG. 2, the mask assembly 40 may include a mask frame 41, a sheet portion 42, a first mask 43, a second mask 44, and a shield stick 45.

The mask frame 41 may have multiple sides connected to each other and may include a first opening OP41 defined by the sides. For example, the first opening OP41 may be surrounded by the sides and may pass through a center of the mask frame 41.

In an embodiment, the mask frame 41 may have a quadrangular shape in a plan view. However, a shape of the mask frame 41 is not limited thereto, and the mask frame 41 may have various polygonal shapes. Hereinafter, a case in which the mask frame 41 is a quadrangular frame will be described.

In case that the mask frame 41 is a quadrangular frame, the sides may include a first side S1 extending in a first direction (e.g., an X-axis direction) and a second side S2 extending in a second direction (e.g., a Y-axis direction) crossing the first direction. The first side S1 may include a pair of first sides S1 facing each other, the second side S2 may include a pair of second sides S2 facing each other, and the first side S1 and the second side S2 may be connected to each other. In an embodiment, the first side S1 may be a short side, and the second side S2 may be a long side. However, the disclosure is not limited thereto, and the first side S1 may be a long side and the second side S2 may be a short side, or lengths of the first side S1 and the second side S2 may be the same. Hereinafter, a case in which the first side S1 is a short side and the second side S2 is a long side will be described.

The sheet portion 42 may be fixed on the mask frame 41 in a tensioned state to overlap a portion of the first opening OP41 of the mask frame 41. The sheet portion 42 may include multiple second openings. The first mask 43 may be disposed to be correspond to the second openings (OP42 in FIG. 4) of the sheet portion 42 and be fixed on the sheet portion 42 in a tensioned state. The second mask 44 may be fixed on the mask frame 41 in a tensioned state to overlap another portion of the first opening OP41 of the mask frame 41.

The shield stick 45 may be fixed on the mask frame 41 in a tensioned state to cross the first opening OP41 of the mask frame 41. The shield stick 45 may include multiple shield sticks 45. One of the shield sticks 45 may be arranged along a boundary between the sheet portion 42 and the second mask 44. One of the shield sticks 45 may be arranged along a boundary between one of the first side S1 of the mask frame 41 and the first opening OP41. At least one of the shield sticks 45 may be arranged along a boundary between another one of the first side S1 of the mask frame 41 and the first opening OP41. Accordingly, the deposition material M (refer to FIG. 1) supplied by the deposition source 50 (refer to FIG. 1) may not pass between the sheet portion 42 and the second mask 44, between the one of the first side S1 of the mask frame 41 and the first opening OP41, and between the another one of the first side S1 of the mask frame 41 and the first opening OP41.

FIGS. 3 to 7 are plan views for describing a method of manufacturing the mask assembly 40, according to an embodiment.

Figure 3:
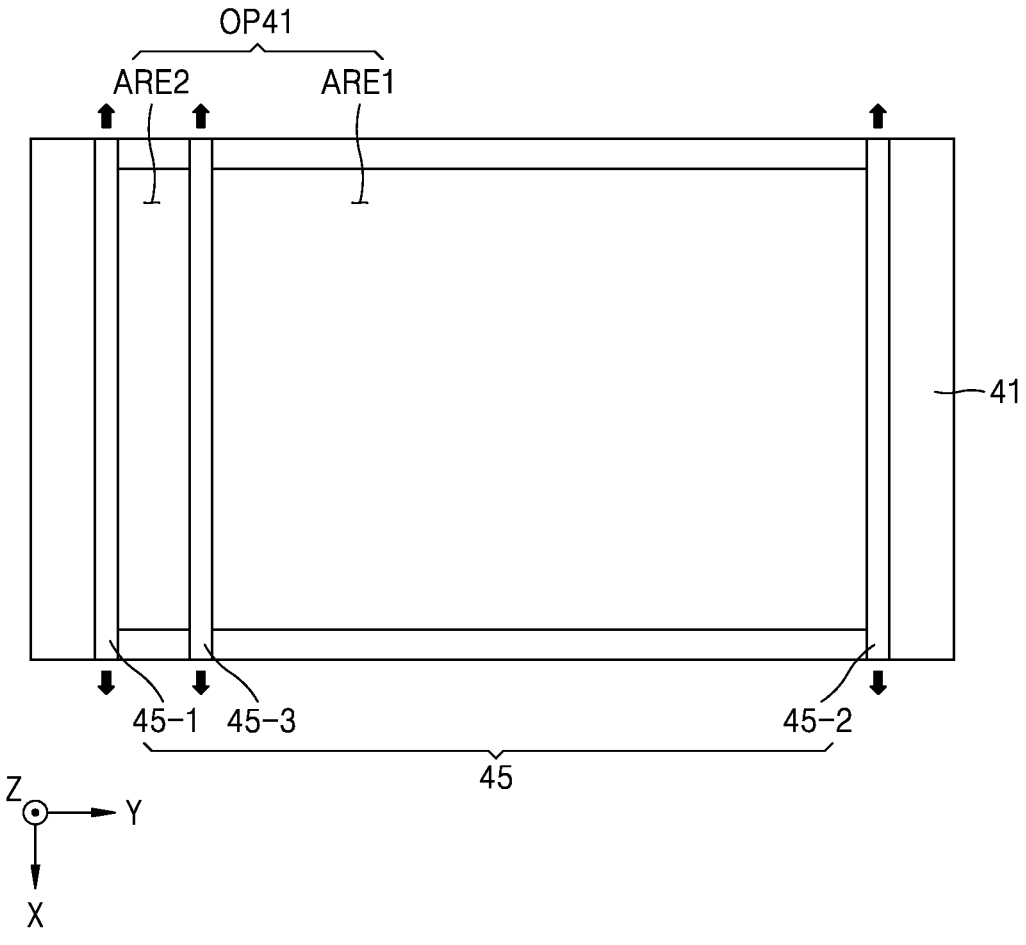
FIGS. 3 to 7 are plan views for describing a method of manufacturing a mask assembly, according to an embodiment.

Referring to FIG. 3, the shield stick 45 may be disposed on the mask frame 41. The shield stick 45 may cross the first opening OP41 of the mask frame 41. The shield stick 45 may be welded to the mask frame 41 in a state of being tensioned in a first direction (e.g., an X-axis direction). The shield stick 45 may include a first shield stick 45-1, a second shield stick 45-2, and a third shield stick 45-3.

The first shield stick 45-1 may be arranged along a boundary between the mask frame 41 and the first opening OP41. For example, the first shield stick 45-1 may overlap one of the short sides of the mask frame 41. In the structure described above, at least a portion of the first shield stick 45-1 may overlap the mask frame 41, and the remaining portion of the first shield stick 45-1 may overlap the first opening OP41.

The second shield stick 45-2 may be arranged along a boundary between the mask frame 41 and the first opening OP41. The second shield stick 45-2 may be spaced apart from the first shield stick 45-1 in parallel. For example, the second shield stick 45-2 may overlap another one of the short sides of the mask frame 41. In the structure described above, at least a portion of the second shield stick 45-2 may overlap the mask frame 41, and the remaining portion of the second shield stick 45-2 may overlap the first opening OP41.

The third shield stick 45-3 may be arranged between the first shield stick 45-1 and the second shield stick 45-2. The third shield stick 45-3 may be spaced apart from the first shield stick 45-1 and the second shield stick 45-2 in parallel. Although FIG. 3 shows one third shield stick 45-3, the disclosure is not limited thereto, and the third shield stick 45-3 may include multiple third shield sticks 45-3. At least one of the third shield sticks 45-3 may divide the first opening OP41 of the mask frame 41 into a first area ARE1 and a second area ARE2.

Figure 4:
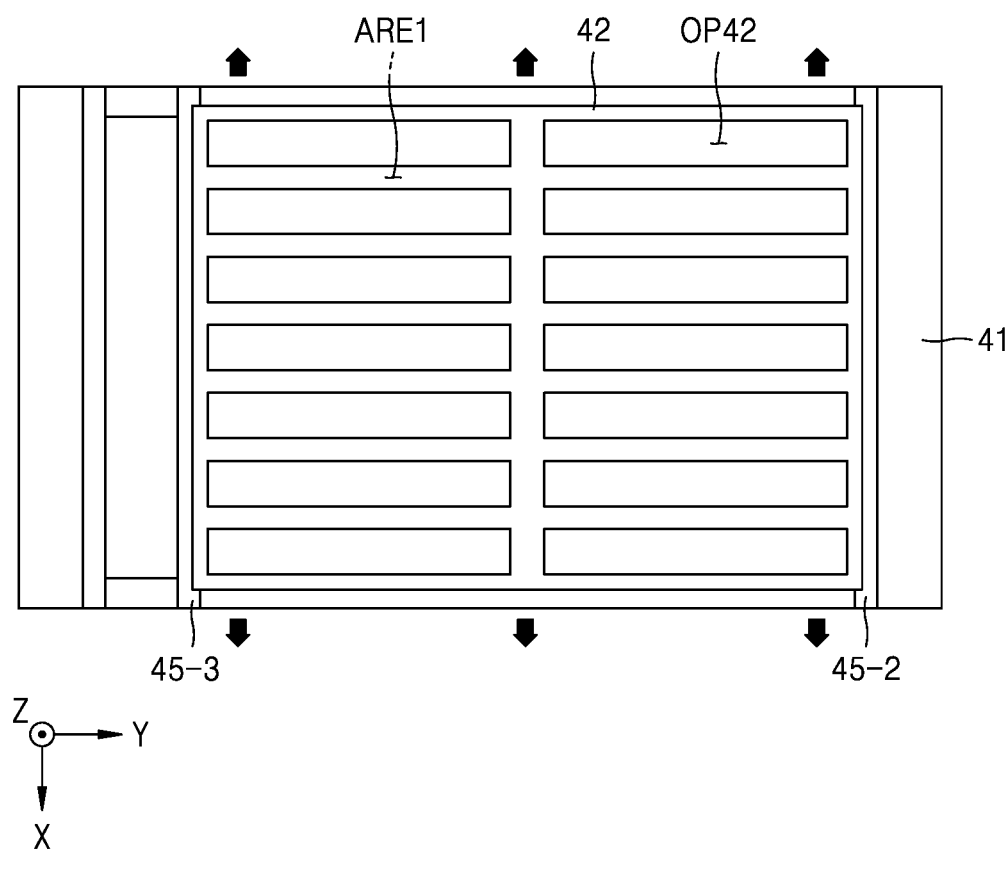

Referring to FIG. 4, the sheet portion 42 may be disposed on the mask frame 41. The sheet portion 42 may be fixed on the mask frame 41 to overlap a portion of the first opening OP41. For example, the sheet portion 42 may be disposed over the first area ARE1 of the first opening OP41. The sheet portion 42 may have a shape corresponding to the first area ARE1 of the first opening OP41. For example, as shown in FIG. 4, the sheet portion 42 may have a quadrangle shape in a plan view. The sheet portion 42 may be fixed on the mask frame 41 in a state of being tensioned in the first direction. Two sides of the sheet portion 42 spaced apart from each other may each be fixed on the mask frame 41, another side of the sheet portion 42 may be fixed on the second shield stick 45-2, and the other side of the sheet portion 42 may be fixed on the third shield stick 45-3.

The sheet portion 42 may include multiple second openings OP42. The second openings OP42 may be arranged in the first direction and a second direction (e.g., a Y-axis direction) crossing the first direction. For example, as shown in FIG. 4, the second openings OP42 may be arranged in 7 rows and 2 columns. However, the number and arrangement of second openings OP42 are not limited thereto. Although FIG. 4 shows each of the second openings OP42 having the same quadrangular shape, the disclosure is not limited thereto. The second opening OP42 may have various shapes, and a shape of each of the second openings OP42 may be different.

Figure 5:
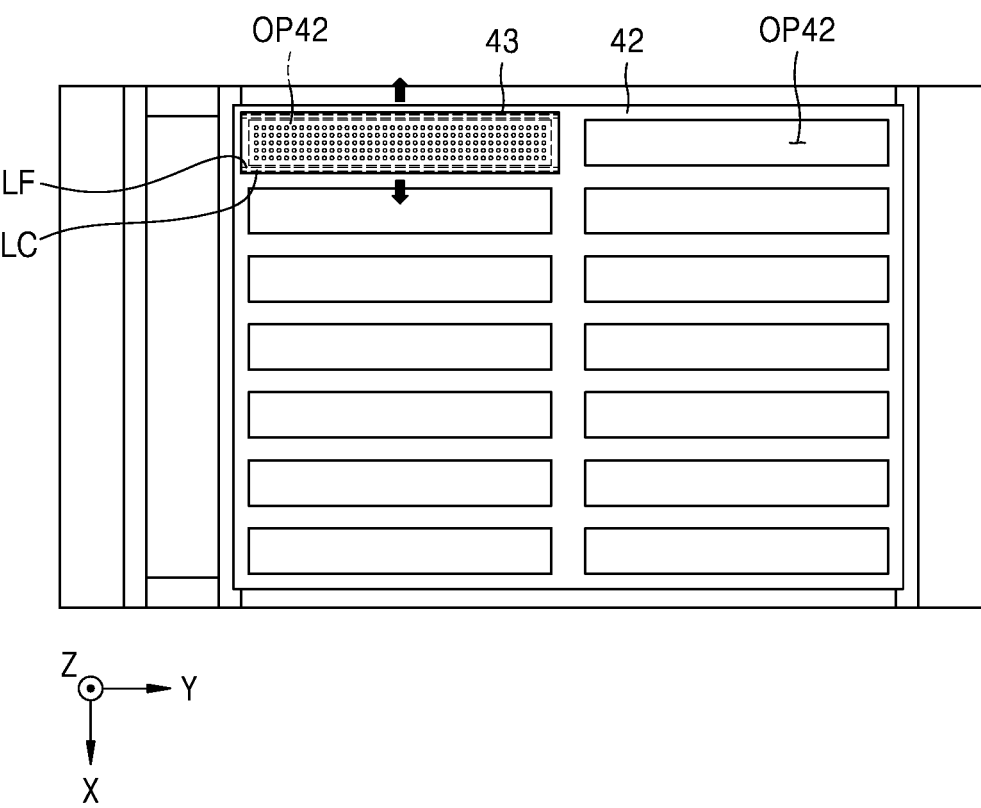

Referring to FIG. 5, the first mask 43 may be disposed on the sheet portion 42. The first mask 43 may be fixed on the sheet portion 42 to overlap the second opening OP42. The first mask 43 may have a shape corresponding to the second opening OP42. For example, as shown in FIG. 5, the first mask 43 may have a quadrangle shape in a plan view. The first mask 43 may be fixed on the sheet portion 42 in a state of being tensioned in the first direction. The first mask 43 may include a fixed line LF and a cutting line LC.

The first mask 43 may be fixed on the sheet portion 42 along the fixed line LF in a state of being tensioned in the first direction. For example, the first mask 43 may be welded to the sheet portion 42 along the fixed line LF. The fixed line LF may extend in the second direction crossing the first direction. The fixed line LF may include multiple fixed lines LF. For example, the fixed line LF may include two fixed lines LF, and the two fixed lines LF may be spaced apart from each other with the second opening OP42 therebetween.

At least a portion of the first mask 43 may be cut along the cutting line LC while the first mask 43 is fixed on the sheet portion 42. The cutting line LC may extend in the second direction parallel to the fixed line LF. The cutting line LC may include multiple cutting lines LC. For example, the cutting line LC may include two cutting lines LC, and the two cutting lines LC may be spaced apart from each other with the fixed line LF therebetween.

Figure 6:
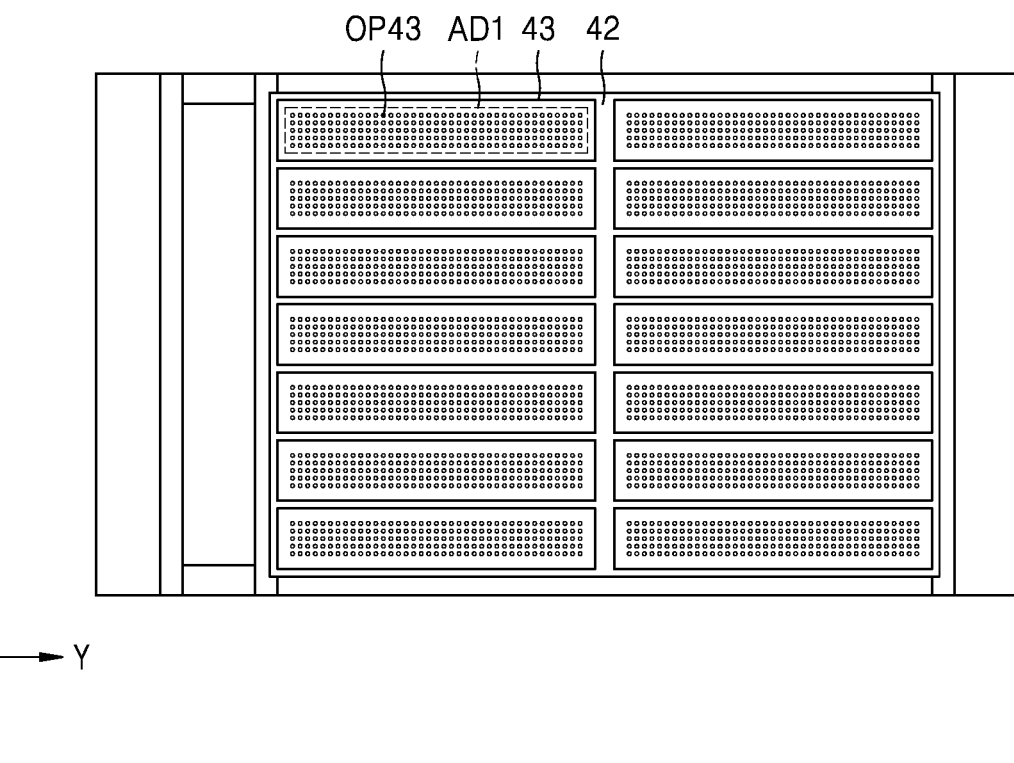

Referring to FIG. 6, multiple first masks 43 may be disposed on the sheet portion 42. The first masks 43 may be arranged in correspondence with the arrangement of the second openings OP42. The first masks 43 may be arranged in the first direction and the second direction crossing the first direction. For example, in case that the second openings OP42 are arranged in 7 rows and 2 columns as shown in FIG. 4, the first masks 43 may also be arranged in 7 rows and 2 columns.

The first mask 43 may include multiple third openings OP43. The deposition material M (refer to FIG. 1) supplied by the deposition source 50 (refer to FIG. 1) may pass through the third openings OP43. The third openings OP43 may be arranged in a first deposition area AD1 of the first mask 43. For example, as shown in FIG. 6, the third openings OP43 may be arranged in the first direction and the second direction crossing the first direction in the first deposition area AD1. For example, a shape of the third openings OP43 may be a circle in a plan view. However, the arrangement and shape of third openings OP43 are not limited thereto.

Figure 7:
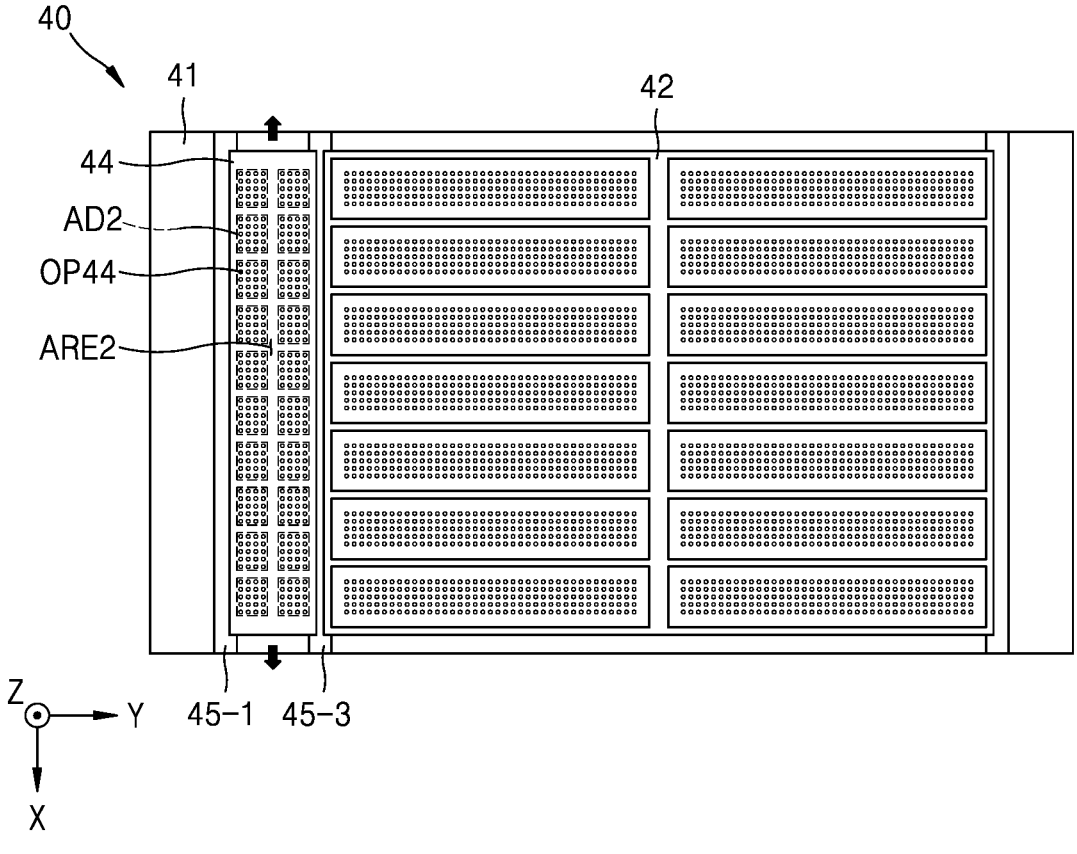

Referring to FIG. 7, the second mask 44 may be disposed on the mask frame 41. The second mask 44 may be disposed in a space of the first opening OP41 defined by an edge of the sheet portion 42 and inner surfaces of the first opening OP41 and be fixed on the mask frame 41. For example, the second mask 44 may be disposed in the second area ARE2 of the first opening OP41. The second mask 44 may have a shape corresponding to the second area ARE2 of the first opening OP41. For example, as shown in FIG. 7, a shape of the second mask 44 may be a quadrangle in a plan view. The second mask 44 may be fixed on the mask frame 41 in a state of being tensioned in the first direction. Two sides of the second mask 44 spaced apart from each other may each be fixed on the mask frame 41, another side of the second mask 44 may be fixed on the first shield stick 45-1, and the other side of the second mask 44 may be fixed on the third shield stick 45-3.

The second mask 44 may include multiple fourth openings OP44. The deposition material M supplied by the deposition source 50 may pass through the fourth openings OP44. The fourth openings OP44 may be arranged in a second deposition area AD2 of the second mask 44. For example, as shown in FIG. 7, the fourth openings OP44 may be arranged in the first direction and the second direction crossing the first direction in the second deposition area AD2. For example, a shape of the fourth openings OP44 may be a circle in a plan view. However, the arrangement and shape of fourth openings OP44 are not limited thereto.

In one second mask 44, the second deposition area AD2 may include multiple second deposition areas AD2, and the second deposition areas AD2 may be apart from each other. The second deposition areas AD2 may be arranged in the first direction and the second direction crossing the first direction. For example, as shown in FIG. 7, the second deposition areas AD2 may be arranged in 10 rows and 2 columns. However, the number and arrangement of second deposition areas AD2 are not limited thereto.

Referring to FIGS. 1 to 7, an area of the sheet portion 42 may be greater than an area of the second mask 44 in a plan view. The sheet portion 42 and the first mask 43 may be disposed on an area of the first opening OP41 of the mask frame 41, and the second mask 44 may be disposed on another area of the first opening OP41, for example, the second area ARE2. Accordingly, space utilization of the mask assembly 40 may be improved due to the mixed arrangement of the sheet portion 42 and the first mask 43, and the second mask 44.

Figure 8:
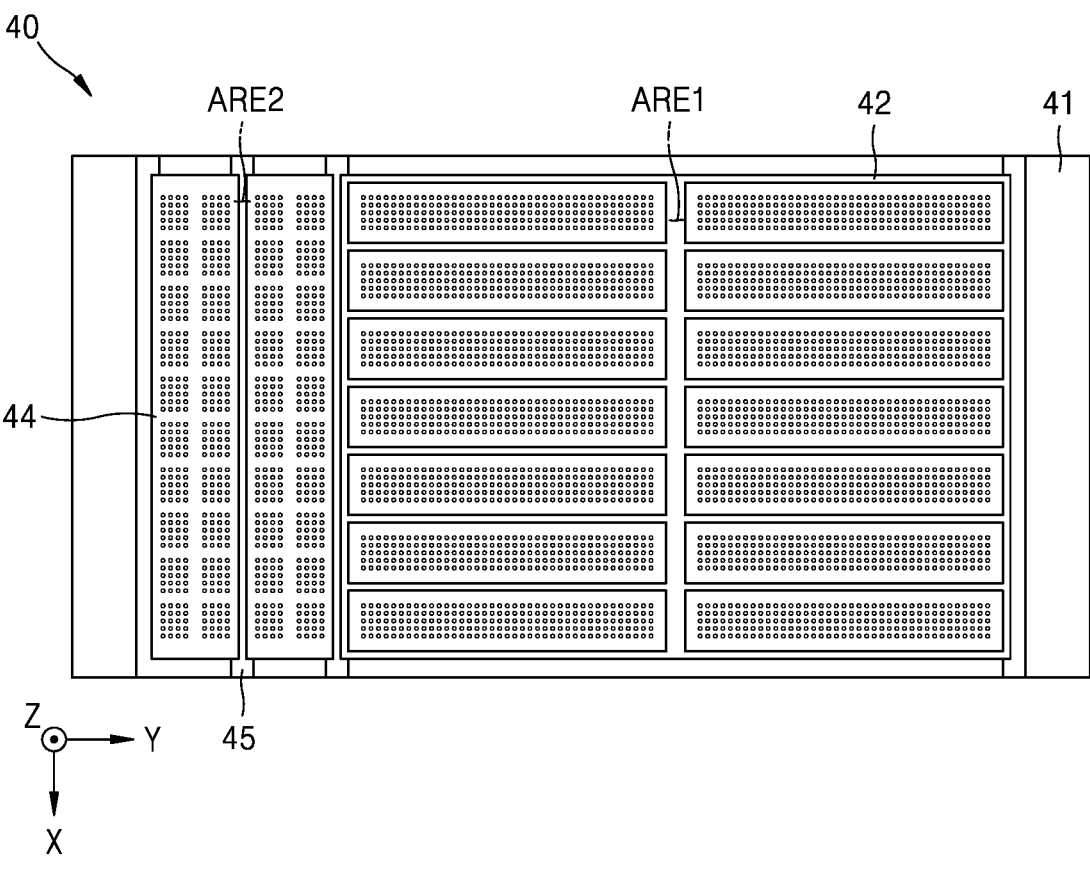
FIG. 8 is a plan view of a mask assembly according to another embodiment.

FIG. 8 is a plan view of the mask assembly 40 according to another embodiment. Descriptions thereof that are the same as or similar to those of FIGS. 1 to 7 are omitted for convenience.

Referring to FIG. 8, compared to the embodiment described with reference to FIG. 7, in the second area ARE2, the second mask 44 may include multiple second masks 44. The second masks 44 may be arranged adjacent to each other in a second direction (e.g., a Y-axis direction). For example, the second masks 44 and the sheet portion 42 may be sequentially arranged in the second direction. At least one of the shield sticks 45 may be arranged along a boundary between adjacent second masks 44 in the second direction. Accordingly, the deposition material M (refer to FIG. 1) supplied by the deposition source 50 (refer to FIG. 1) may not pass between the adjacent second masks 44.

Although FIG. 8 shows two second masks 44 disposed over the second area ARE2 for convenience of explanation, the number of second masks 44 is not limited thereto. The number of second masks 44 disposed on the mask frame 41 may be determined according to an area of the second area ARE2 formed after the sheet portion 42 is disposed over the first area ARE1.

Figure 9:
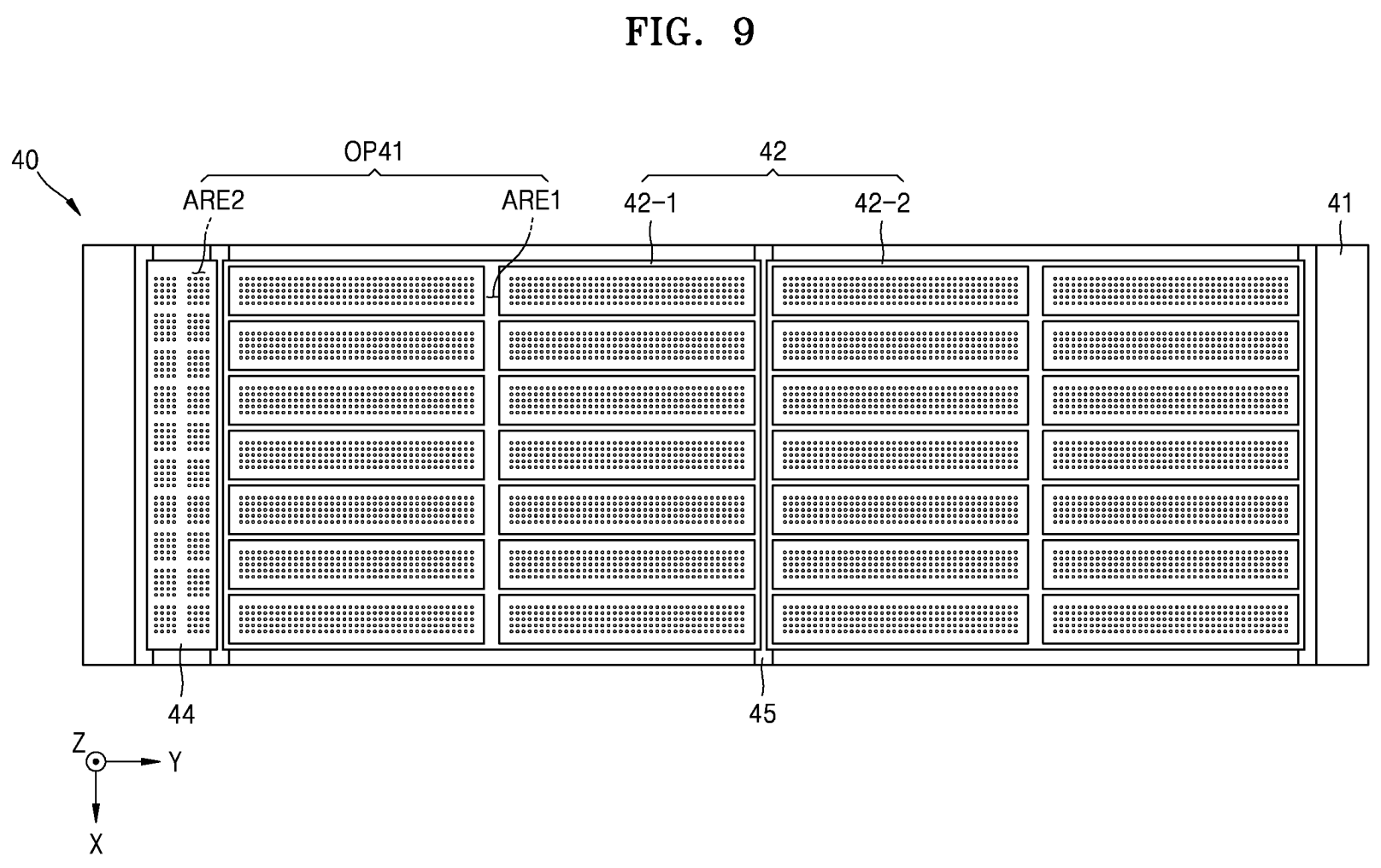

FIG. 9 is a plan view of the mask assembly 40 according to another embodiment. Descriptions thereof that are the same as or similar to those of FIGS. 1 to 7 are omitted for convenience.

Referring to FIG. 9, compared to the embodiment described with reference to FIG. 7, in the first area ARE1, the sheet portion 42 may include multiple sheet portions 42. For example, the sheet portion 42 may include a first sheet portion 42-1 and a second sheet portion 42-2.

The first sheet portion 42-1 and the second sheet portion 42-2 may be arranged adjacent to each other in a second direction (e.g., a Y-axis direction). For example, the second mask 44, the first sheet portion 42-1, and the second sheet portion 42-2 may be sequentially arranged in the second direction. One of the shield sticks 45 may be arranged along a boundary between the first sheet portion 42-1 and the second sheet portion 42-2. Accordingly, the deposition material M (refer to FIG. 1) supplied by the deposition source 50 (refer to FIG. 1) may not pass between the first sheet portion 42-1 and the second sheet portion 42-2.

Although FIG. 9 shows two sheet portions 42 disposed over the first area ARE1 for convenience of explanation, the number of sheet portions 42 is not limited thereto. The number of sheet portions 42 disposed on the mask frame 41 may be determined according to an area of the first opening OP41. For example, in case that an area of the first opening OP41 is greater than a sum of areas of three mask sheets and less than a sum of areas of four mask sheets in a plan view, the three mask sheets may be disposed in the first area ARE1, and the second mask 44 may be disposed in the remaining second area ARE2.

Figure 10:
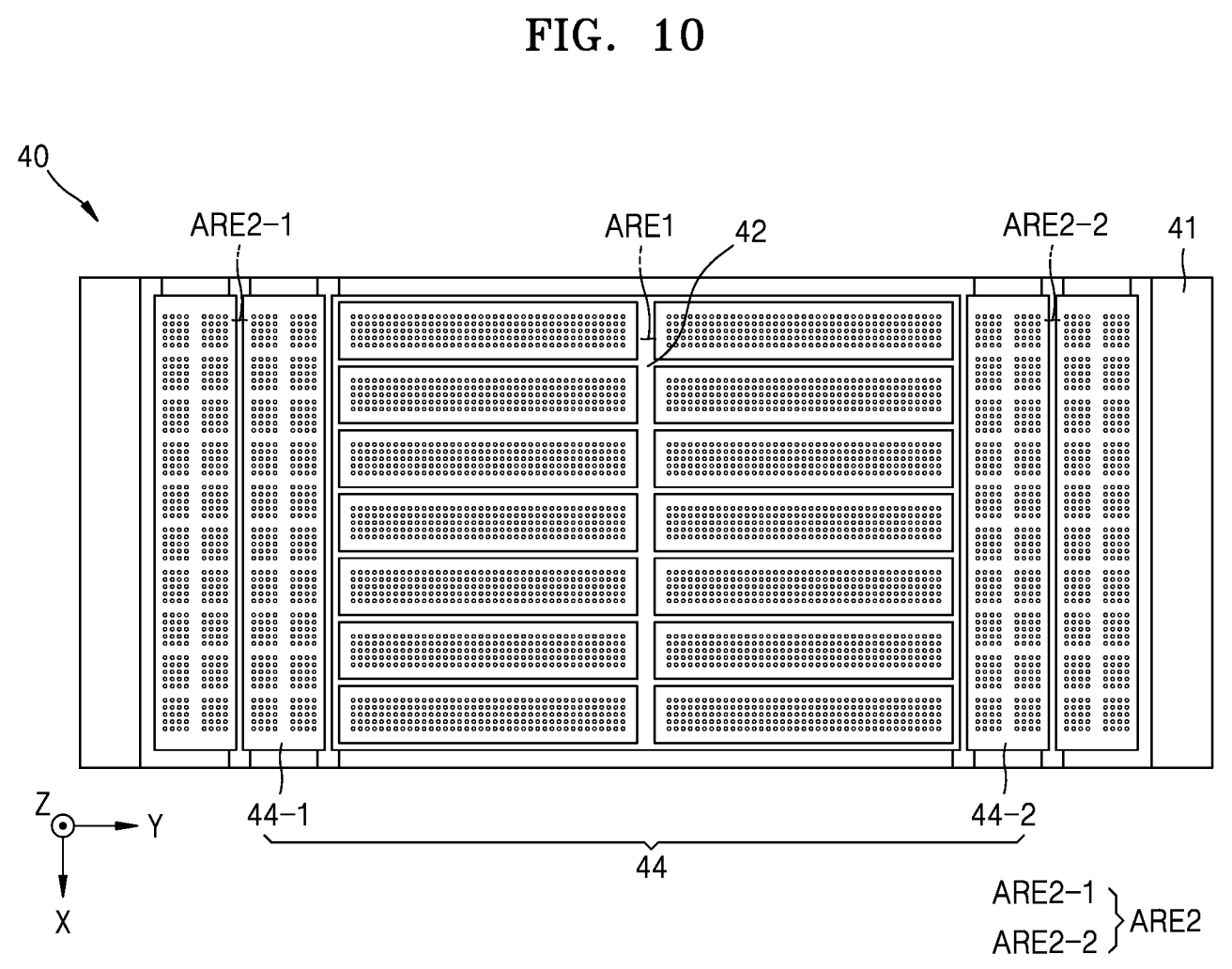

FIG. 10 is a plan view of the mask assembly 40 according to another embodiment. Descriptions thereof that are the same as or similar to those of FIGS. 1 to 7 are omitted for convenience.

Referring to FIG. 10, compared to the embodiment described with reference to FIG. 7, the second mask 44 may include multiple second masks 44, and two of the second masks 44 may be spaced apart from each other with the sheet portion 42 therebetween. The second mask 44 may include a 2-1 mask 44-1 and a 2-2 mask 44-2. The 2-1 mask 44-1 and the 2-2 mask 44-2 may be spaced apart from each other with the sheet portion 42 therebetween.

In the structure described above, the second area ARE2 may include a 2-1 area ARE2-1 where the 2-1 mask 44-1 is disposed and a 2-2 area ARE2-2 where the 2-2 mask 44-2 is disposed. The 2-1 area ARE2-1 and the 2-2 area ARE2-2 may be spaced apart from each other with the first area ARE1 therebetween. As shown in FIG. 10, a shape of the mask assembly 40 may be symmetrical in a plan view. Accordingly, even in case that heat is applied to the mask assembly 40, thermal strain of the mask assembly 40 may be significantly reduced.

At least one of the 2-1 mask 44-1 and the 2-2 mask 44-2 may be provided in plural. For example, as shown in FIG. 10, each of the 2-1 mask 44-1 and the 2-2 mask 44-2 may include two 2-1 masks 44-1 and two 2-2 masks 44-2. However, the numbers of 2-1 masks 44-1 and 2-2 masks 44-2 are not limited thereto. The numbers of 2-1 masks 44-1 and 2-2 masks 44-2 disposed on the mask frame 41 may be determined according to areas of the 2-1 area ARE2-1 and the 2-2 area ARE2-2 formed after the sheet portion 42 is disposed in the first area ARE1.

Figure 11:
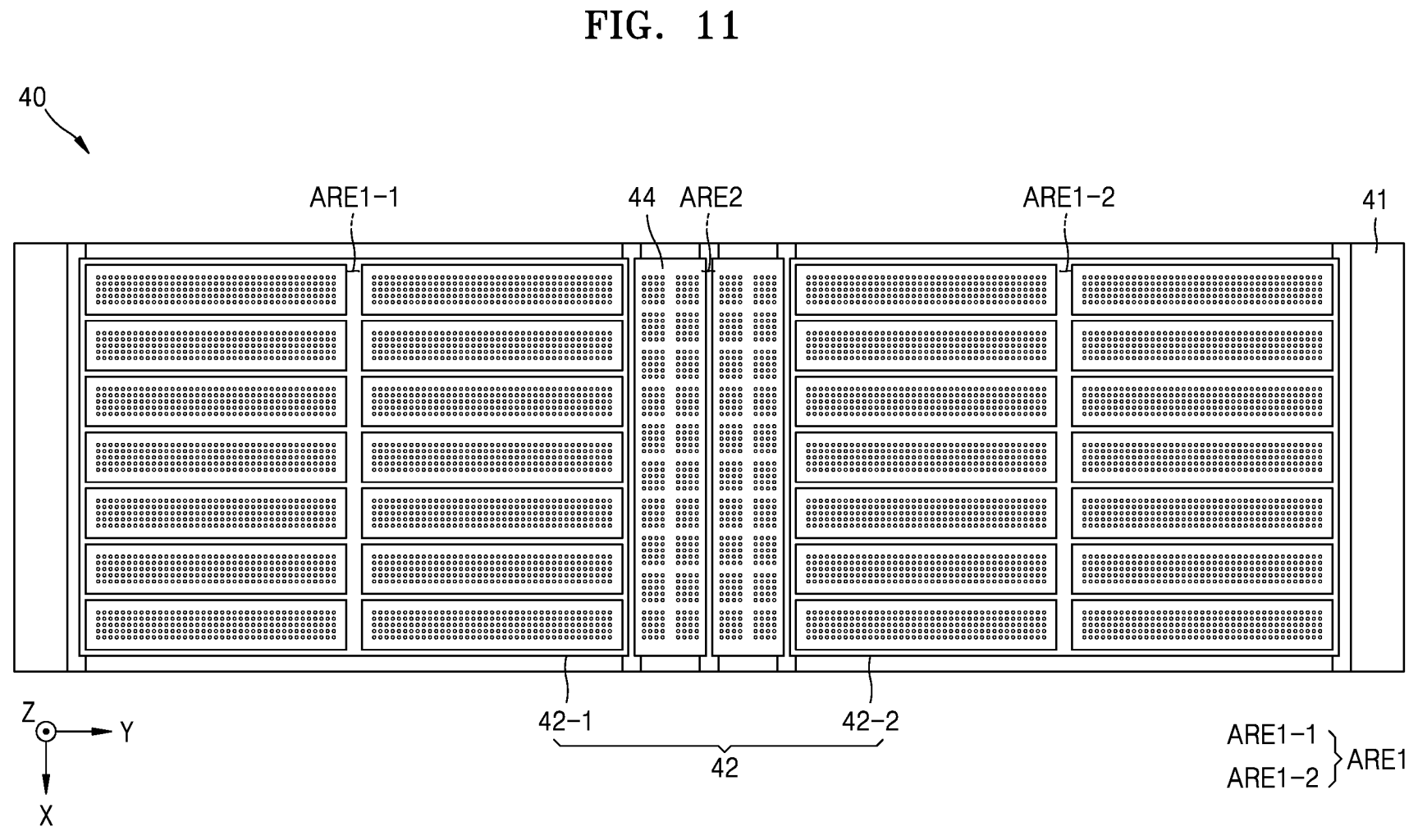

FIG. 11 is a plan view of the mask assembly 40 according to another embodiment. Descriptions thereof that are the same as or similar to those of FIGS. 1 to 7 are omitted for convenience.

Referring to FIG. 11, compared to the embodiment described with reference to FIG. 7, the sheet portion 42 may include multiple sheet portions 42, and two of the sheet portions 42 may be arranged apart from each other with the second mask 44 therebetween. The sheet portion 42 may include the first sheet portion 42-1 and the second sheet portion 42-2. The first sheet portion 42-1 and the second sheet portion 42-2 may be spaced apart from each other with the second mask 44 therebetween.

In the structure described above, the first area ARE1 may include a 1-1 area ARE1-1 where the first sheet portion 42-1 is disposed and a 1-2 area ARE1-2 where the second sheet portion 42-2 is disposed. The 1-1 area ARE1-1 and the 1-2 area ARE1-2 may be spaced apart from each other with the second area ARE2 therebetween. As shown in FIG. 11, a shape of the mask assembly 40 may be symmetrical in a plan view. Accordingly, even in case that heat is applied to the mask assembly 40, thermal strain of the mask assembly 40 may be significantly reduced.

The second mask 44 may include multiple second masks 44. For example, as shown in FIG. 11, the second mask 44 may include two second masks 44. However, the number of second masks 44 is not limited thereto. The number of second masks 44 disposed on the mask frame 41 may be determined according to an area of the second area ARE2 formed after the first sheet portion 42-1 is disposed in the 1-1 area ARE1-1 and the second sheet portion 42-2 is disposed in the 1-2 area ARE1-2.

Figure 12:
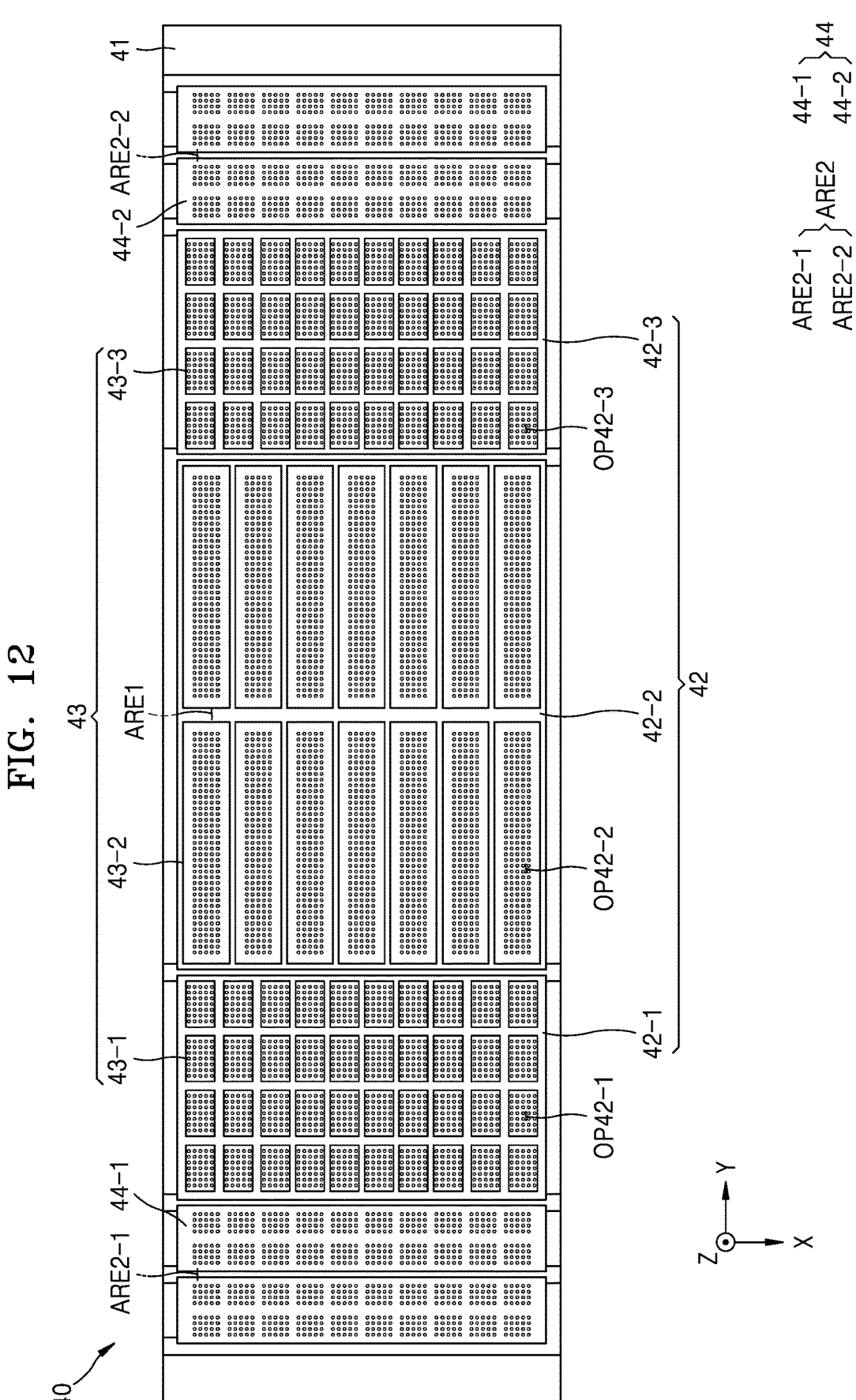
FIG. 12 is a plan view of a mask assembly according to another embodiment.

FIG. 12 is a plan view of the mask assembly 40 according to another embodiment. Descriptions thereof that are the same as or similar to those of FIGS. 1 to 7 are omitted for convenience.

Referring to FIG. 12, compared to the embodiment described with reference to FIG. 7, in the first area ARE1, the sheet portion 42 may include multiple sheet portions 42. For example, the sheet portion 42 may include a first sheet portion 42-1, a second sheet portion 42-2, and a third sheet portion 42-3.

The first sheet portion 42-1, the second sheet portion 42-2, and the third sheet portion 42-3 may be sequentially arranged in a second direction (e.g., a Y-axis direction). For example, the first sheet portion 42-1 and the third sheet portion 42-3 may be arranged apart from each other with the second sheet portion 42-2 therebetween.

Areas of at least two of the first sheet portion 42-1, second sheet portion 42-2, and the third sheet portion 42-3 may be different from each other in a plan view. Areas of the first sheet portion 42-1 and the second sheet portion 42-2 may be different from each other, areas of the second sheet portion 42-2 and the third sheet portion 42-3 may be different from each other, and areas of the first sheet portion 42-1 and the third sheet portion 42-3 may be the same in a plan view. Although FIG. 12 shows areas of the first sheet portion 42-1 and the third sheet portion 42-3 less than an area of the second sheet portion 42-2, relative areas between the first sheet portion 42-1, the second sheet portion 42-2, and the third sheet portion 42-3 are not limited thereto.

The first sheet portion 42-1 may include multiple 2-1 openings OP42-1, the second sheet portion 42-2 may include multiple 2-2 openings OP42-2, and the third sheet portion 42-3 may include multiple 2-3 openings OP42-3. Areas of at least two of the 2-1 openings OP42-1, the 2-2 openings OP42-2, and the 2-3 openings OP42-3 may be different from each other in a plan view. Areas of the 2-1 openings OP42-1 and the 2-2 openings OP42-2 may be different from each other, areas of the 2-2 openings OP42-2 and the 2-3 openings OP42-3 may be different from each other, and areas of the 2-1 openings OP42-1 and the 2-3 openings OP42-3 may be the same in a plan view. Although FIG. 12 shows areas of the 2-1 openings OP42-1 and the 2-3 openings OP42-3 less than an area of the 2-2 openings OP42-2, relative areas between the 2-1 openings OP42-1, the 2-2 openings OP42-2, and the 2-3 openings OP42-3 are not limited thereto.

The first mask 43 may include 1-1 masks 43-1 corresponding to the 2-1 openings OP42-1, 1-2 masks 43-2 corresponding to the 2-2 openings OP42-2, and 1-3 masks 43-3 corresponding to the 2-3 openings OP42-3. Accordingly, like the 2-1 openings OP42-1, the 2-2 openings OP42-2, and the 2-3 openings OP42-3, areas of at least two of the 1-1 masks 43-1, the 1-2 masks 43-2, and the 1-3 masks 43-3 may be different from each other in a plan view. Areas of the 1-1 masks 43-1 and the 1-2 masks 43-2 may be different from each other, areas of the 1-2 masks 43-2 and the 1-3 masks 43-3 may be different from each other, and areas of the 1-1 masks 43-1 and the 1-3 masks 43-3 may be the same in a plan view.

Although FIG. 12 shows the 2-1 openings OP42-1 and the 1-1 masks 43-1 arranged in 10 rows and 4 columns, the 2-2 openings OP42-2 and the 1-2 masks 43-2 arranged in 7 rows and 2 columns, and the 2-3 openings OP42-3 and the 1-3 masks 43-3 arranged in 10 rows and 4 columns, each arrangement of the second openings OP42 and the first masks 43 is not limited thereto.

The second mask 44 may include multiple second masks 44, and two of the second masks 44 may be spaced apart from each other with the sheet portion 42 therebetween. The second mask 44 may include a 2-1 mask 44-1 and a 2-2 mask 44-2. The 2-1 mask 44-1 and the 2-2 mask 44-2 may be spaced apart from each other with the sheet portion 42 therebetween.

In the structure described above, the second area ARE2 may include a 2-1 area ARE2-1 where the 2-1 mask 44-1 is disposed and a 2-2 area ARE2-2 where the 2-2 mask 44-2 is disposed. The 2-1 area ARE2-1 and the 2-2 area ARE2-2 may be spaced apart from each other with the first area ARE1 therebetween.

At least one of the 2-1 mask 44-1 and the 2-2 mask 44-2 may be provided in plural. For example, as shown in FIG. 12, each of the 2-1 mask 44-1 and the 2-2 mask 44-2 may include two 2-1 masks 44-1 and two 2-2 masks 44-2. However, the numbers of 2-1 masks 44-1 and 2-2 masks 44-2 are not limited thereto. The numbers of 2-1 masks 44-1 and 2-2 masks 44-2 disposed on the mask frame 41 may be determined according to areas of the 2-1 area ARE2-1 and the 2-2 area ARE2-2 formed after the sheet portion 42 is disposed in the first area ARE1.

According to the structure described above, as shown in FIG. 12, a shape of the mask assembly 40 may be symmetrical in a plan view. Accordingly, even in case that heat is applied to the mask assembly 40, thermal strain of the mask assembly 40 may be significantly reduced.

Figure 13:
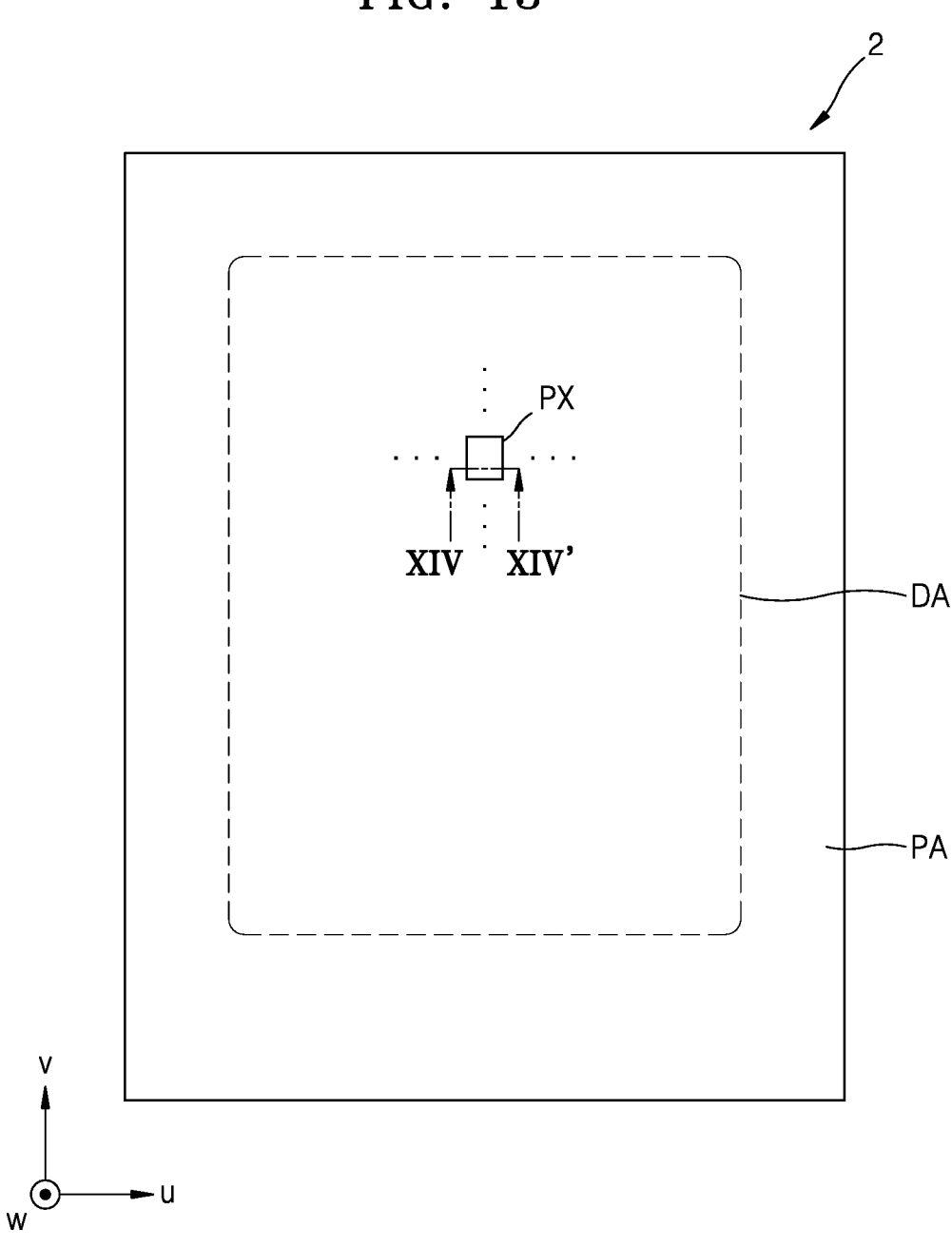
FIG. 13 is a schematic plan view of a display device manufactured by using a method of manufacturing a display device, according to an embodiment.

FIG. 13 is a schematic plan view of a display device 2 manufactured by using a method of manufacturing a display device, according to an embodiment.

Referring to FIG. 13, the display device 2 manufactured according to an embodiment may include a display area DA and a peripheral area PA located adjacent to the display area DA. The display device 2 may provide an image through an array of multiple pixels PX two-dimensionally arranged in the display area DA.

The peripheral area PA may be an area where no image is provided, and may entirely or partially surround the display area DA. A driver for providing an electrical signal or power to a pixel circuit corresponding to each of the pixels PX may be arranged in the peripheral area PA. A pad, which is an area to which an electronic device or a printed circuit board is electrically connected, may be arranged in the peripheral area PA.

Hereinafter, the display device 2 including an organic light-emitting diode as a light-emitting element will be described, but the display device 2 is not limited thereto. In another embodiment, the display device 2 may be a light-emitting display device including an inorganic light-emitting diode, for example, an inorganic light-emitting display. The inorganic light-emitting diode may include a PN junction diode including inorganic semiconductor-based materials. In case that a voltage is applied to the PN junction diode in a forward direction, holes and electrons may be injected, and energy generated by the recombination of the holes and electrons may be converted into light energy to emit light of a certain color. The inorganic light-emitting diode described above may have a width of several to hundreds of micrometers, and in some embodiments, the inorganic light-emitting diode may be referred to as a micro-LED. In another embodiment, the display device 2 may be a quantum dot light-emitting display.

The display device 2 may be used as a display screen of not only portable electronic devices, such as a mobile phone, a smartphone, a tablet personal computer (PC), a mobile communication terminal, an electronic notebook, an e-book, a portable multimedia player (PMP), a navigation system, and an ultra-mobile PC (UMPC), but also various products, such as a television, a notebook computer, a monitor, a billboard, and an Internet of things (IoT) device. The display device 2 according to an embodiment may be used in wearable devices, such as a smartwatch, a watch phone, a glasses-type display, and a head-mounted display (HMD). The display device 2 according to an embodiment may be used as a car's instrument panel, a center information display (CID) placed on a car's center fascia or dashboard, a room mirror display replacing a car's side mirror, or a display screen placed on the back of a front seat as entertainment for a car's rear seat.

Figure 14:
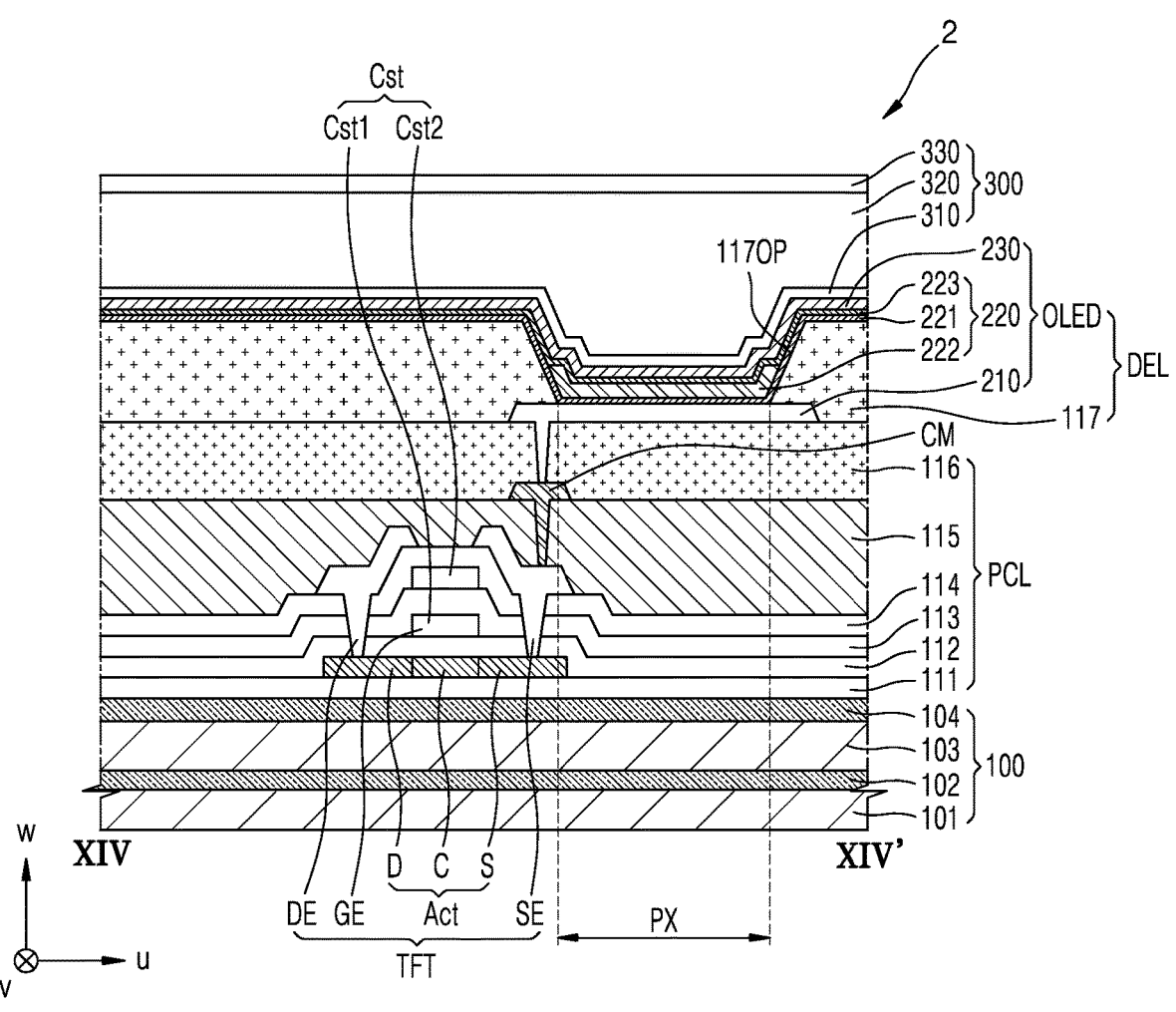
FIG. 14 is a schematic cross-sectional view of a display device manufactured by using a method of manufacturing a display device, according to an embodiment.

FIG. 14 is a schematic cross-sectional view of the display device 2 manufactured by using a method of manufacturing a display device, according to an embodiment, and may correspond to a cross-section of the display device 2 taken along line XIV-XIV' of FIG. 13.

Referring to FIG. 14, the display device 2 may include a stacked structure of the substrate 100, a pixel circuit layer PCL, a display element layer DEL, and an encapsulation layer 300.

The substrate 100 may have a multi-layer structure including a base layer and an inorganic layer, the base layer including a polymer resin. For example, the substrate 100 may include a base layer including a polymer resin, and a barrier layer of an inorganic insulating layer. For example, the substrate 100 may include a first base layer 101, a first barrier layer 102, a second base layer 103, and a second barrier layer 104 sequentially stacked. The first base layer 101 and the second base layer 103 may include polyimide (PI), polyethersulfone (PES), polyarylate, polyetherimide (PEI), polyethylene naphthalate (PEN), polyethylene tere-phthalate (PET), polyphenylene sulfide (PPS), polycarbon-ate, cellulose triacetate (TAC) and/or cellulose acetate pro-pionate (CAP). The first barrier layer 102 and the second barrier layer 104 may include an inorganic insulating mate-rial, such as silicon oxide, silicon oxynitride, and/or silicon nitride. The substrate 100 may be flexible.

The pixel circuit layer PCL may be disposed on the substrate 100. FIG. 14 shows the pixel circuit layer PCL including a thin-film transistor TFT, and a buffer layer 111, a first gate insulating layer 112, a second gate insulating layer 113, an interlayer insulating layer 114, a first planar-ization insulating layer 115, and a second planarization insulating layer 116 disposed under and/or on elements of the thin-film transistor TFT.

The buffer layer 111 may reduce or prevent penetration of foreign materials, moisture, or external air from the substrate 100 and may provide a flat surface on the substrate 100. The buffer layer 111 may include an inorganic insulating mate-rial, such as silicon oxide, silicon oxynitride, and/or silicon nitride, and may have a single-layer or multi-layer structure including the above-described material.

The thin-film transistor TFT on the buffer layer 111 may include a semiconductor layer Act, and the semiconductor layer Act may include polysilicon (poly-Si). In another embodiment, the semiconductor layer Act may include amorphous silicon (a-Si), an oxide semiconductor, or an organic semiconductor, etc. The semiconductor layer Act may include a channel region C, and a drain region D and a source region S respectively arranged on each side of the channel region C. A gate electrode GE may overlap the channel region C in a plan view.

The gate electrode GE may include a low-resistance metal. The gate electrode GE may include a conductive material such as molybdenum (Mo), aluminum (Al), copper (Cu), titanium (Ti), etc., and may have a multi-layer or single-layer structure including the above-described mate-rial.

The first gate insulating layer 112 between the semicon-ductor layer Act and the gate electrode GE may include an inorganic insulating material, such as silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_X$). Zinc oxide ($ZnO_X$) may be zinc oxide (ZnO) and/or zinc peroxide ($ZnO_2$).

The second gate insulating layer 113 may cover the gate electrode GE. Similarly to the first gate insulating layer 112, the second gate insulating layer 113 may include an inor-ganic insulating material, such as silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_X$). Zinc oxide ($ZnO_X$) may be zinc oxide (ZnO) and/or zinc peroxide ($ZnO_2$).

An upper electrode Cst2 of a storage capacitor Cst may be disposed on the second gate insulating layer 113. The upper electrode Cst2 may overlap the gate electrode GE thereunder in a plan view. The gate electrode GE and the upper electrode Cst2 overlapping each other with the second gate insulating layer 113 therebetween may constitute a storage capacitor Cst. For example, the gate electrode GE may serve as a lower electrode Cst1 of the storage capacitor Cst.

As described above, the storage capacitor Cst and the thin-film transistor TFT may overlap each other in a plan view. In some embodiments, the storage capacitor Cst may not overlap the thin-film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chro-mium (Cr), calcium (Ca), molybdenum (Mo), titanium (Ti), tungsten (W) and/or copper (Cu), and may have a single-layer or multi-layer structure including the above-described material.

The interlayer insulating layer 114 may cover the upper electrode Cst2. The interlayer insulating layer 114 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_X$). Zinc oxide ($ZnO_X$) may be zinc oxide (ZnO) and/or zinc peroxide ($ZnO_2$). The interlayer insulat-ing layer 114 may have a single-layer or multi-layer struc-ture including the above-described inorganic insulating material.

A drain electrode DE and a source electrode SE may each be on the interlayer insulating layer 114. The drain electrode DE and the source electrode SE may be respectively con-nected to the drain region D and the source region S through contact holes formed in the insulating layers thereunder. The drain electrode DE and the source electrode SE may include a highly conductive material. The drain electrode DE and the source electrode SE may include a conductive material such as molybdenum (Mo), aluminum (Al), copper (Cu), titanium (Ti), etc., and may have a multi-layer or single-layer struc-ture including the above-described material. In an embodi-ment, the drain electrode DE and the source electrode SE may have a multi-layer structure of titanium (Ti)/aluminum (Al)/titanium (Ti).

The first planarization insulating layer 115 may cover the drain electrode DE and the source electrode SE. The first planarization insulating layer 115 may include an organic insulating material, such as a general commercial polymer, such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The second planarization insulating layer 116 may be disposed on the first planarization insulating layer 115. The second planarization insulating layer 116 and the first pla-narization insulating layer 115 may include a same material. For example, the second planarization insulating layer 116 may include an organic insulating material, such as a general commercial polymer, such as PMMA or PS, a polymer derivative having a phenol-based group, an acryl-based polymer, an imide-based polymer, an aryl ether-based poly-mer, an amide-based polymer, a fluorine-based polymer, a p-xylene-based polymer, a vinyl alcohol-based polymer, and a blend thereof.

The display element layer DEL may be disposed on the pixel circuit layer PCL having the above-described structure. The display element layer DEL may include an organic light-emitting diode OLED as a display element (for example, a light-emitting element), and the organic light-emitting diode OLED may include a stacked structure of a pixel electrode 210, an intermediate layer 220, and a com-mon electrode 230. The organic light-emitting diode OLED, for example, may emit red, green, or blue light, or may emit red, green, blue, or white light. The organic light-emitting diode OLED may emit light through an emission area, and the emission area may be defined in a pixel PX.

The pixel electrode 210 of the organic light-emitting diode OLED may be electrically connected to the thin-film transistor TFT through contact holes formed in the second planarization insulating layer 116 and the first planarization insulating layer 115 and a contact metal CM disposed on the first planarization insulating layer 115.

The pixel electrode 210 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 210 may further include a layer formed of ITO, IZO, ZnO, or $In_2O_3$ on or under the above-described reflective layer.

A bank layer 117 including an opening 117OP exposing a central portion of the pixel electrode 210 may be disposed on the pixel electrode 210. The bank layer 117 may include an organic insulating material and/or an inorganic insulating material. The opening 117OP may define an emission area of light emitted from the organic light-emitting diode OLED. For example, a size/width of the opening 117OP may correspond to a size/width of the emission area. Accordingly, a size and/or width of the pixel PX may depend on a size and/or width of the corresponding opening 117OP of the bank layer 117.

The intermediate layer 220 may include an emission layer 222 corresponding to the pixel electrode 210. The emission layer 222 may include a polymer organic material or low-molecular weight organic material emitting light of a certain color. In another embodiment, the emission layer 222 may include an inorganic light-emitting material or quantum dots.

In an embodiment, the intermediate layer 220 may include a first functional layer 221 and a second functional layer 223 respectively disposed under and on the emission layer 222. The first functional layer 221 may include, for example, a hole transport layer (HTL), or an HTL and a hole injection layer (HIL). The second functional layer 223 may be an element disposed on the emission layer 222, and may include an electron transport layer (ETL) and/or an electron injection layer (EIL). Like the common electrode 230 described below, the first functional layer 221 and/or the second functional layer 223 may be a common layer covering the entire substrate 100.

The common electrode 230 may be disposed above the pixel electrode 210 and may overlap the pixel electrode 210 in a plan view. The common electrode 230 may include a conductive material having a low work function. For example, the common electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In another embodiment, the common electrode 230 may further include a layer, such as ITO, IZO, ZnO, or $In_2O_3$, on the (semi) transparent layer including the above-described material. The common electrode 230 may be formed as one body covering the entire substrate 100.

The encapsulation layer 300 may be disposed on the display element layer DEL and may cover the display element layer DEL. The encapsulation layer 300 may include at least one inorganic encapsulation layer and at least one organic encapsulation layer, and as an embodiment, FIG. 14 shows the encapsulation layer 300 including a first inorganic encapsulation layer 310, an organic encapsulation layer 320, and a second inorganic encapsulation layer 330 sequentially stacked.

The first inorganic encapsulation layer 310 and the second inorganic encapsulation layer 330 may include one or more inorganic materials among aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acryl-based resin, an epoxy-based resin, PI, and polyethylene. In an embodiment, the organic encapsulation layer 320 may include acrylate. The organic encapsulation layer 320 may be formed by curing a monomer or applying a polymer. The organic encapsulation layer 320 may have transparency.

Although not shown, a touch sensor layer may be disposed on the encapsulation layer 300, and an optical functional layer may be disposed on the touch sensor layer. The touch sensor layer may receive an external input, for example, coordinate information according to a touch event. The optical functional layer may reduce the reflectivity of light (e.g., external light) incident on the display device from the outside and/or may improve color purity of light emitted from the display device. In an embodiment, the optical functional layer may include a retarder and/or a polarizer. The retarder may be of a film type or a liquid crystal coating type and may include a $\lambda/2$ retarder and/or a $\lambda/4$ retarder. The polarizer may also be of a film type or a liquid crystal coating type. The film type may include a stretchable synthetic resin film, and the liquid crystal coating type may include liquid crystals arranged in an arrangement. The display device 2 may further include a protection film (not illustrated).

An adhesive member may be disposed between the touch sensor layer and the optical functional layer. Any general adhesive material may be employed without limitation. The adhesive member may be a pressure-sensitive adhesive (PSA).

The deposition material M described with reference to FIGS. 1 to 12 may constitute the intermediate layer 220 described with reference to FIG. 14. For example, the deposition material M may constitute the emission layer 222.

Figure 15:
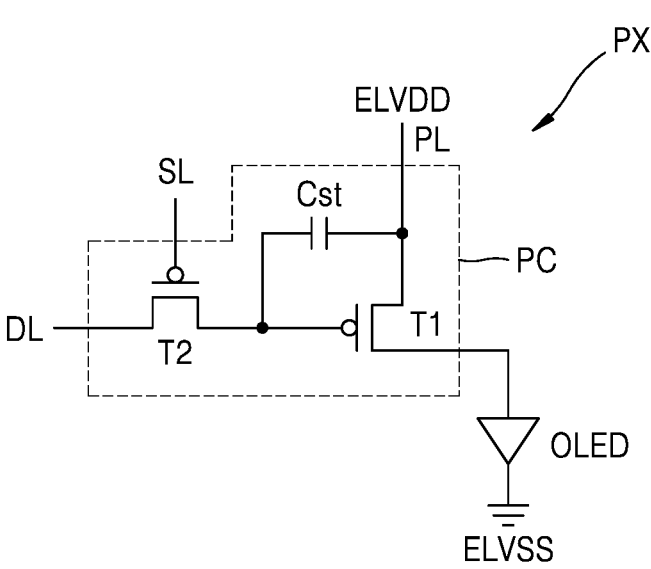
FIG. 15 is schematic diagram of an equivalent circuit of one pixel in a display panel according to an embodiment.

FIG. 15 is schematic diagram of an equivalent circuit of one pixel PX in a display panel according to an embodiment.

Each pixel PX may include a pixel circuit PC and a display element connected to the pixel circuit PC, for example, the organic light-emitting diode OLED. The pixel circuit PC may include a first thin-film transistor T1, a second thin-film transistor T2, and a storage capacitor Cst. Each pixel PX may emit, for example, red, green, blue, or white light, through the organic light-emitting diode OLED.

The second thin-film transistor T2, which is a switching thin-film transistor, may be connected to a scan line SL and a data line DL and may be transmit a data voltage input from the data line DL to the first thin-film transistor T1, based on a switching voltage input from the scan line SL. The storage capacitor Cst may be connected to the second thin-film transistor T2 and a driving voltage line PL and may store a voltage corresponding to a difference between a voltage received from the second thin-film transistor T2 and a first power voltage ELVDD supplied to the driving voltage line PL.

The first thin-film transistor T1, which is a driving thin-film transistor, may be connected to the driving voltage line PL and the storage capacitor Cst and may be control a driving current flowing to the organic light-emitting diode OLED from the driving voltage line PL, in response to a voltage value stored in the storage capacitor Cst. The organic light-emitting diode OLED may emit light having a luminance according to the driving current. An opposite electrode (e.g., a cathode) of the organic light-emitting diode OLED may receive a second power voltage ELVSS.

Although FIG. 15 shows the pixel circuit PC including two thin-film transistors and one storage capacitor, the disclosure is not limited thereto. The number of thin-film transistors and the number of storage capacitors may be variously modified according to the design of the pixel circuit PC. For example, the pixel circuit PC may include four, five, or more thin-film transistors in addition to the two thin-film transistors described above.

According to one or more of the above-described embodiments, space utilization of a mask assembly may be improved due to the arrangement of a first mask and a second mask.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. An apparatus for manufacturing a display device, the apparatus comprising:
a mask assembly; and
a deposition source that supplies a deposition material toward the mask assembly,
wherein the mask assembly comprises:
a mask frame comprising a first opening;
a sheet portion fixed on the mask frame, overlapping a portion of the first opening in a plan view, and comprising a plurality of second openings;
a plurality of first masks corresponding to the plurality of second openings and fixed on the sheet portion, each of the plurality of first masks comprising a plurality of third openings; and
a second mask arranged on another portion of the first opening defined by an edge of the sheet portion and inner surfaces of the first opening, fixed on the mask frame, and comprising a plurality of fourth openings,
wherein the sheet portion further comprises:
a first sheet portion comprising a plurality of 2-1 openings; and
a second sheet portion spaced apart from the first sheet portion and comprising a plurality of 2-2 openings,
wherein
the first sheet portion and the second sheet portion are spaced apart from each other, and
the second mask is disposed between the first sheet portion and the second sheet portion.

2. The apparatus of claim 1, wherein an area of the sheet portion in a plan view is greater than an area of the second mask in a plan view.

3. The apparatus of claim 1, wherein an area of the first sheet portion and an area of the second sheet portion in a plan view are different from each other.

4. The apparatus of claim 1, wherein an area of each of the plurality of 2-1 openings and an area of each of the plurality of 2-2 openings in a plan view are different from each other.

5. The apparatus of claim 4, wherein the plurality of first masks further comprise:
a plurality of 1-1 masks corresponding to the 2-1 openings; and
a plurality of 1-2 masks corresponding to the 2-2 openings,
wherein an area of each of the plurality of 1-1 masks and an area of each of the plurality of 1-2 masks in a plan view are different from each other.

6. The apparatus of claim 1, wherein the second mask further comprises:
a 2-1 mask; and
a 2-2 mask spaced apart from the 2-1 mask.

7. The apparatus of claim 6, wherein
the 2-1 mask and the 2-2 mask are spaced apart from each other, and
the sheet portion is disposed between the 2-1 mask and the 2-2 mask.

8. The apparatus of claim 1, wherein the mask assembly further comprises a shield stick fixed on the mask frame crossing the first opening along a boundary between the sheet portion and the second mask.

9. A method of manufacturing a display device, the method comprising:
arranging a mask assembly; and
supplying a deposition material toward the mask assembly,
wherein the arranging of the mask assembly comprises:
arranging a mask frame comprising a first opening;
a sheet portion fixing operation comprising tensioning a sheet portion comprising a plurality of second openings and fixing the sheet portion to the mask frame to overlap a portion of the first opening in a plan view;
a first mask fixing operation comprising tensioning a plurality of first masks and fixing the plurality of first masks to the sheet portion to correspond to the plurality of second openings; and
a second mask fixing operation comprising tensioning a second mask and fixing the second mask to the mask frame on another portion of the first opening defined by an edge of the sheet portion and inner surfaces of the first opening-,
wherein the fixing of the sheet portion comprises:
fixing a first sheet portion comprising a plurality of 2-1 openings to the mask frame; and
fixing a second sheet portion comprising a plurality of 2-2 openings to the mask frame to be spaced apart from the first sheet portion,
wherein
the first sheet portion and the second sheet portion are spaced apart from each other, and
the second mask is disposed between the first sheet portion and the second sheet portion.

10. The method of claim 9, wherein an area of the sheet portion in a plan view is greater than an area of the second mask in a plan view.

11. The method of claim 9, wherein an area of the first sheet portion and an area of the second sheet portion in a plan view are different from each other.

12. The method of claim 9, wherein an area of each of the plurality of 2-1 openings and an area of each of the plurality of 2-2 openings in a plan view are different from each other.

13. The method of claim 12, wherein the fixing of the plurality of first masks comprises:

fixing a plurality of 1-1 masks to the sheet portion to correspond to the plurality of 2-1 openings; and fixing a plurality of 1-2 masks to the sheet portion to correspond to the plurality of 2-2 openings, wherein an area of each of the plurality of 1-1 masks and an area of each of the plurality of 1-2 masks in a plan view are different from each other.

14. The method of claim 9, wherein the fixing of the second mask comprises:

fixing a 2-1 mask to the mask frame; and fixing a 2-2 mask to the mask frame spaced apart from the 2-1 mask.

15. The method of claim 14, wherein the 2-1 mask and the 2-2 mask are spaced apart from each other, and the sheet portion is disposed between the 2-1 mask and the 2-2 mask.

16. The method of claim 9, wherein the arranging of the mask assembly further comprises tensioning a shield stick and fixing the shield stick to the mask frame crossing the first opening along a boundary between the sheet portion and the second mask.

\* \* \* \* \*